(12) United States Patent
Sirinorakul et al.

(10) Patent No.: US 8,816,482 B2
(45) Date of Patent: Aug. 26, 2014

(54) FLIP-CHIP LEADFRAME SEMICONDUCTOR PACKAGE

(75) Inventors: Saravuth Sirinorakul, Bangkok (TH); Kasemsan Kongthaworn, Patumthani (TH)

(73) Assignee: United Test and Assembly Center Ltd., Singapore (SG)

( * ) Notice: Subject to any disclaimer, the term of this patent is extended or adjusted under 35 U.S.C. 154(b) by 0 days.

(21) Appl. No.: 12/330,681

(22) Filed: Dec. 9, 2008

(65) Prior Publication Data

US 2009/0146276 A1 Jun. 11, 2009

Related U.S. Application Data

(60) Provisional application No. 60/996,934, filed on Dec. 11, 2007.

(51) Int. Cl.
*H01L 23/495* (2006.01)
*H01L 21/00* (2006.01)
*H01L 21/56* (2006.01)
*H01L 23/31* (2006.01)
*H01L 23/00* (2006.01)

(52) U.S. Cl.
CPC ........ *H01L 23/49548* (2013.01); *H01L 21/565* (2013.01); *H01L 2224/16245* (2013.01); *H01L 2224/32245* (2013.01); *H01L 23/49572* (2013.01); *H01L 2224/48257* (2013.01); *H01L 23/49551* (2013.01); *H01L 2224/48091* (2013.01); *H01L 2224/73265* (2013.01); *H01L 24/48* (2013.01); *H01L 23/3107* (2013.01); *H01L 2224/48247* (2013.01); *H01L 2224/48465* (2013.01)

USPC .......... 257/673; 257/674; 257/693; 438/123; 438/124; 438/127

(58) Field of Classification Search
CPC ................... H01L 23/49575; H01L 23/3107; H01L 23/49; H01L 24/16; H01L 23/28; H01L 23/488
See application file for complete search history.

(56) References Cited

U.S. PATENT DOCUMENTS

| | | | | |
|---|---|---|---|---|
| 4,994,895 | A | * | 2/1991 | Matsuzaki et al. ............ 257/791 |
| 5,859,471 | A | * | 1/1999 | Kuraishi et al. ............... 257/666 |
| 6,080,264 | A | * | 6/2000 | Ball .............................. 156/292 |
| 6,759,737 | B2 | * | 7/2004 | Seo et al. ...................... 257/686 |
| 7,170,168 | B2 | * | 1/2007 | Wu et al. ....................... 257/734 |
| 2003/0178717 | A1 | * | 9/2003 | Singh ............................ 257/696 |
| 2008/0073763 | A1 | * | 3/2008 | Jungsuwadee ................ 257/676 |
| 2009/0269885 | A1 | * | 10/2009 | Madrid et al. ................ 438/119 |

FOREIGN PATENT DOCUMENTS

JP 2003078235 A * 3/2003

* cited by examiner

*Primary Examiner* — Alonzo Chambliss
(74) *Attorney, Agent, or Firm* — Sughrue Mion, PLLC (57) ABSTRACT

A flip-chip leadframe semiconductor package designed to improve mold flow around the leadframe and semiconductor die. An embodiment of the semiconductor package includes a leadframe, a semiconductor die attached to the leadframe, and an encapsulant covering the leadframe and semiconductor die, wherein a portion of the leadframe that is attached to the semiconductor die is below a portion of the leadframe that enters the encapsulant.

19 Claims, 8 Drawing Sheets

PRIOR ART

FLIP-CHIP LEADFRAME SEMICONDUCTOR PACKAGE

CROSS-REFERENCE TO RELATED APPLICATIONS

This application claims priority from U.S. Provisional Application No. 60/996,934 filed on Dec. 11, 2007, the disclosure of which is incorporated herein by reference.

BACKGROUND OF INVENTION

1. Field of Invention

Apparatuses consistent with the present invention relate to semiconductor packages and methods for manufacturing semiconductor packages. More particularly, the present invention relates to flip-chip leadframe semiconductor packages designed to improve mold flow around the leadframe and semiconductor die.

2. Description of the Related Art

Figure 1:
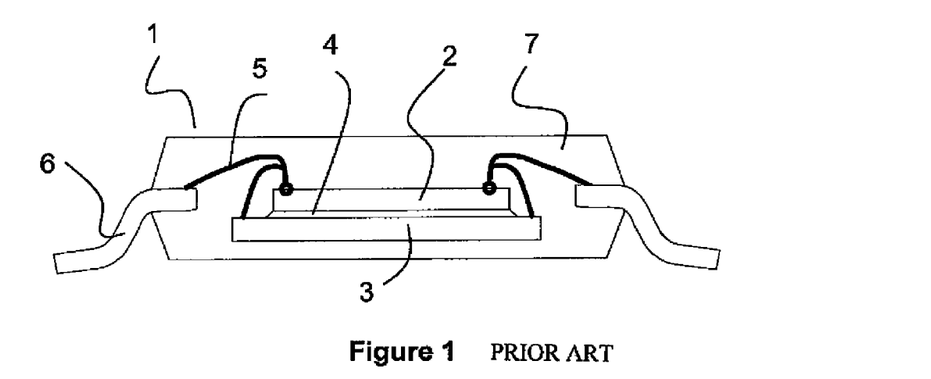
FIG. 1 illustrates a cross-sectional view of a conventional leadframe semiconductor package.

Leadframe semiconductor packages uses metal leads that extend outside the package housing. FIG. 1 is an example of a conventional leadframe package. The package 1 includes a semiconductor die 2 attached to a substrate 3 with an adhesive 4. Wire bonds 5 provide internal electrical connections to the substrate 3 and external connections to the leadframe 6. An encapsulant 7 covers the semiconductor die 2, substrate 3, wire bonds 5 and portions of the leadframe 6.

Figure 2:
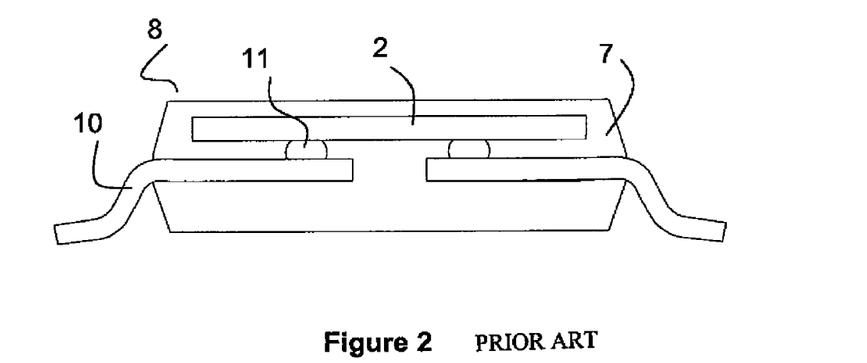
FIGS. 2 and 3 illustrate cross-sectional views of conventional leadframe flip-chip semiconductor packages.
Figure 3:
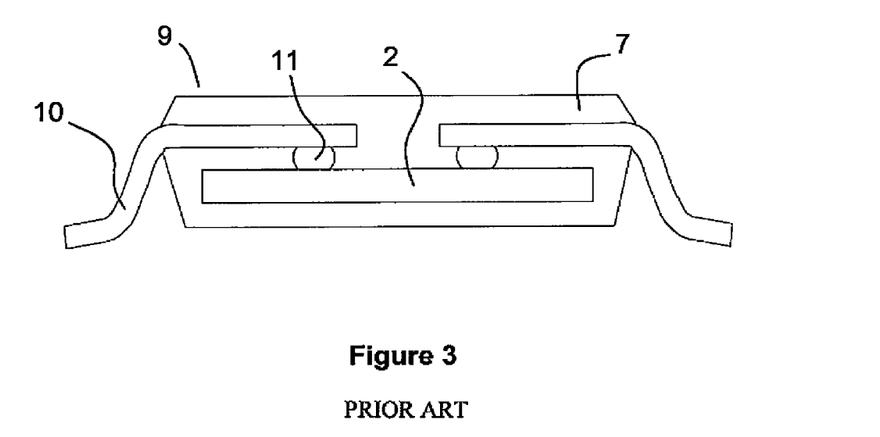

Another type of semiconductor package incorporates leadframe and "flip chip" technology. FIGS. 2 and 3 show examples of leadframe semiconductor packages that use flip chip technology instead of wire bonding technology. The flip chip process is a method for interconnecting semiconductor dies to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect.

In FIGS. 2 and 3, the flip chip lead frame packages 8, 9 include a semiconductor die 2 attached to a leadframe 10 by conductive solder bumps or balls 11. An encapsulant 7 covers the semiconductor die 2 and portions of the leadframe 6.

Figure 4A:
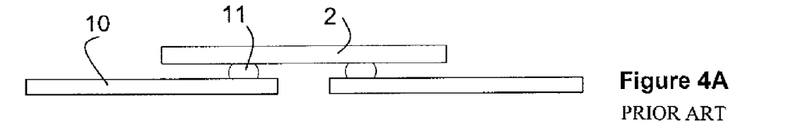
FIGS. 4A through 4F illustrate a method of manufacturing a conventional leadframe flip-chip semiconductor package.
Figure 4B:
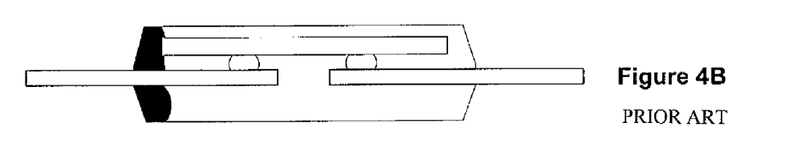

FIGS. 4A through 4F show an embodiment of manufacturing a flip chip leadframe semiconductor package. First, in FIG. 4A, the semiconductor die 2 is attached to the leadframe 10 by solder bumps 11. Next, the semiconductor die and leadframe are placed in a mold (not shown) and an encapsulant is injected into the mold. FIGS. 4B though 4D show how the encapsulant (shown in black) flows in the mold.

Figure 4C:
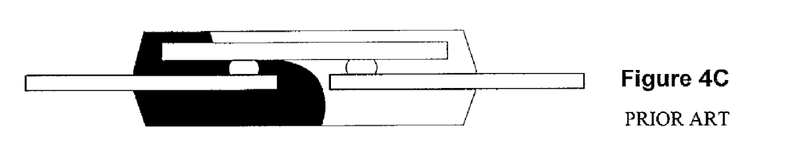
Figure 4D:
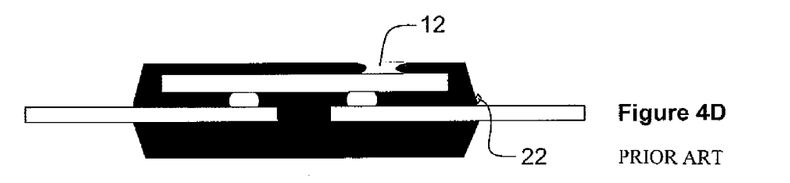
Figure 4E:
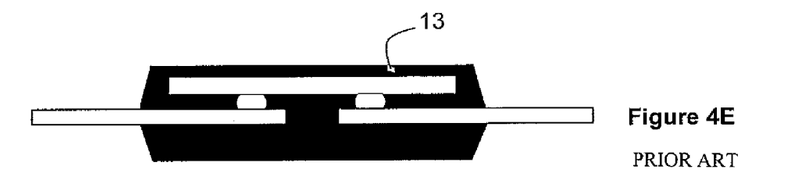
Figure 4F:
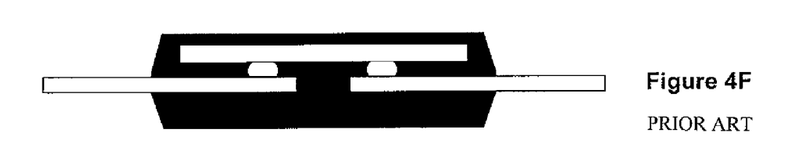

During the initial flow (FIG. 4B) the encapsulant is injected into a mold gate or mold inlet (not shown) and the encapsulant flow is balanced. However, as shown in FIG. 4C, as the encapsulant flows in the area of the semiconductor die, the flow becomes significantly unbalanced. The encapsulant flows faster in the bottom channel, which is wider, than in the top channel, which is narrower. As a result, as shown in FIG. 4D, the encapsulant flows completely through the bottom channel and begins to turn up to the top channel. When the flow from the bottom channel meets the flow from the top channel, an air bubble 12 can be formed. A tiny air vent 22 is typically located at the end of the package where the flows are expected to meet. Air vent 22 is supposed to allow the air bubble 15 that is formed at the end of the package to be vented from the package. However, because of the uneven flows, the air bubble 15 does not meet at the air vent 22. As shown in FIG. 4E, this air bubble, can create a void or incomplete fill 13 after the molding is completed. This is in contrast to a package with a good mold result which is shown in FIG. 4F.

A void or incomplete fill is a defect which is undesirable in semiconductor packages because it can cause a weak point in the molding compound. There are varying sizes of this defect, some that are detectable by the naked eye and others that are in the range of a micrometer in diameter. Moisture can penetrate through this weak point of the compound and then settle in the defect. When the package goes through the reflow process, the moisture which is trapped in the compound changes to a gas and expands, which causes a popcorn effect and then delamination. Delamination is common problem for semiconductor packages. In additional, if the defect occurs on the surface of the package, it is also considered to be a mold visual defect. In some cases, this external defect can make the identification information that is stamped on the device illegible.

Therefore, these is a need for a new design/method that will enable the production of flip chip leadframe semiconductor packages to be produced that will not have voids/incomplete fills in the encapsulant.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

A first embodiment of the semiconductor package includes a leadframe, a semiconductor die attached to the leadframe, and an encapsulant covering the leadframe and semiconductor die, wherein a portion of the leadframe that is attached to the semiconductor die is below a portion of the leadframe that enters the encapsulant.

In another version of this first embodiment, the leadframe includes a portion that slants downward after entering the encapsulant.

In another version of this first embodiment, the semiconductor die is attached to the lead frame by a solder ball.

In another version of this first embodiment, the semiconductor die is in a first plane that is above the portion of the leadframe that enters the encapsulant.

In another version of this first embodiment, the portion of the leadframe that is attached to the semiconductor die forms a second plane and the first and second planes are approximately evenly spaced between a top surface of the semiconductor package and a bottom surface of the semiconductor package.

A second embodiment of the semiconductor package includes a leadframe, a semiconductor die attached to the leadframe, and an encapsulant covering the leadframe and semiconductor die, wherein a portion of the leadframe that is attached to the semiconductor die has a first thickness, a portion of the leadframe that enters the encapsulant has a second thickness, and the first thickness is less than the second thickness.

In another version of this second embodiment, the first thickness is approximately one-half of the second thickness.

In another version of this second embodiment, the semiconductor die is attached to the lead frame by a solder ball.

In another version of this second embodiment, thee semiconductor die does not extend over any portion of the leadframe that has said second thickness.

A third embodiment of the semiconductor package includes a leadframe with a first portion and a second portion, a semiconductor die attached to the first portion of the leadframe, and an encapsulant covering the leadframe and semiconductor die, including the first and second portions, wherein the second portion of the leadframe is below the first portion of the leadframe and the semiconductor die.

In another version of this third embodiment, the leadframe includes a portion that slants downward after entering the encapsulant.

In another version of this third embodiment, the semiconductor die is attached to the lead frame by a solder ball.

In another version of this third embodiment, the semiconductor die is in a first plane that is above the portion of the leadframe that enters the encapsulant.

In another version of this third embodiment, the semiconductor die is in a first plane, the first portion of the leadframe forms a second plane, the second portion of the leadframe forms a third plane, and the first, second and third planes are approximately evenly spaced between a top surface of the semiconductor package and a bottom surface of the semiconductor package.

In another version of this third embodiment, a portion of the leadframe that is attached to the semiconductor die has a first thickness, a portion of the leadframe that enters the encapsulant has a second thickness, and the first thickness is less than the second thickness.

In another version of this third embodiment, the first thickness is approximately one-half of the second thickness.

In another version of this third embodiment, the semiconductor die does not extend over any portion of the leadframe that has the second thickness.

A fourth embodiment of the semiconductor package includes a leadframe, a semiconductor die attached to the leadframe, and an encapsulant covering the leadframe and semiconductor die, wherein a portion of the leadframe that is attached to the semiconductor die is above a portion of the leadframe that enters the encapsulant.

In another version of this fourth embodiment, the leadframe includes a portion that slants upward after entering said encapsulant.

In another version of this fourth embodiment, the semiconductor die is attached to the lead frame by a solder ball.

In another version of this fourth embodiment, the semiconductor die is in a first plane that is below the portion of the leadframe that enters the encapsulant.

In another version of this fourth embodiment, the portion of the leadframe that is attached to the semiconductor die forms a second plane and the first and second planes are approximately evenly spaced between a top surface of the semiconductor package and a bottom surface of the semiconductor package.

A fifth embodiment of the semiconductor package includes a leadframe with a first portion and a second portion, a semiconductor die attached to the first portion of the leadframe, and an encapsulant covering the leadframe and semiconductor die, including the first and second portions, wherein the second portion of the leadframe is above the first portion of the leadframe and the semiconductor die.

In another version of this fifth embodiment, the leadframe includes a portion that slants upward after entering the encapsulant.

In another version of this fifth embodiment, the semiconductor die is attached to the lead frame by a solder ball.

In another version of this fifth embodiment, the semiconductor die is in a first plane that is below the portion of the leadframe that enters the encapsulant.

In another version of this fifth embodiment, the semiconductor die is in a first plane, the first portion of the leadframe forms a second plane, the second portion of the leadframe forms a third plane, and the first, second and third planes are approximately evenly spaced between a top surface of the semiconductor package and a bottom surface of the semiconductor package.

In another version of this fifth embodiment, a portion of the leadframe that is attached to the semiconductor die has a first thickness, a portion of the leadframe that enters the encapsulant has a second thickness, and the first thickness is less than the second thickness.

In another version of this fifth embodiment, the first thickness is approximately one-half of the second thickness.

In another version of this fifth embodiment, the semiconductor die does not extend over any portion of the leadframe that has the second thickness.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Hereinafter, exemplary embodiments of the present invention will be described with reference to the accompanying drawings.

FIGS. 5 and 9A through 9E illustrate cross-sectional views of an exemplary embodiment of the inventive leadframe flip-chip semiconductor package and method and apparatus. The package includes a semiconductor die 2 attached to a leadframe 14 by conductive solder bumps or balls 11. An encapsulant 7 covers the semiconductor die 2 and portions of the leadframe 14. The leadframe 14 is designed with down-set fingers. In the down-set design, the portion of the leadframe that is attached to said semiconductor die is below the portion of the leadframe that enters said encapsulant. For example, leadframe portion 14C is below the level of the leadframe at point 14A. More specifically, in this embodiment, after the leadframe enters the package at point 14A, the leadframe slopes downward in portion 14B and then levels off at portion 14C.

Figure 5:
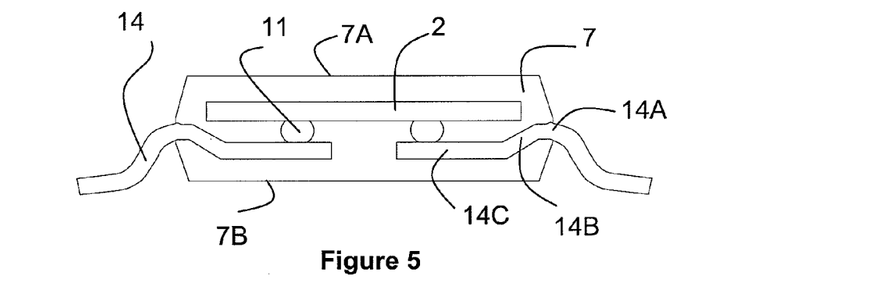
FIG. 5 illustrates a cross-sectional view of an embodiment of the inventive leadframe flip-chip semiconductor package.
Figure 6:
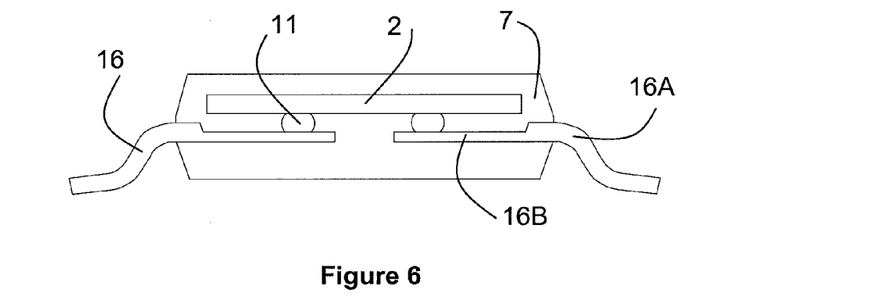
FIG. 6 illustrates a cross-sectional view of a second embodiment of the inventive leadframe flip-chip semiconductor package.

In addition, in this exemplary embodiment, the semiconductor die 2 is in a first plane that is above the portion (14A) of the leadframe that enters the encapsulant 7. The portion of the leadframe (14C) that is attached to the semiconductor die 2 forms a second plane and the first and second planes are approximately evenly spaced between the top surface 7A of the semiconductor package and the bottom surface 7B of the semiconductor package. The even spacing allows for a more balanced mold flow as compared to the conventional design.

Figure 9A:
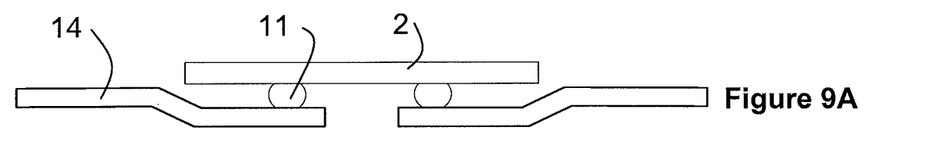
FIGS. 9A through 9E illustrate an a method of manufacturing an embodiment of the inventive leadframe flip-chip semiconductor package.
Figure 9B:
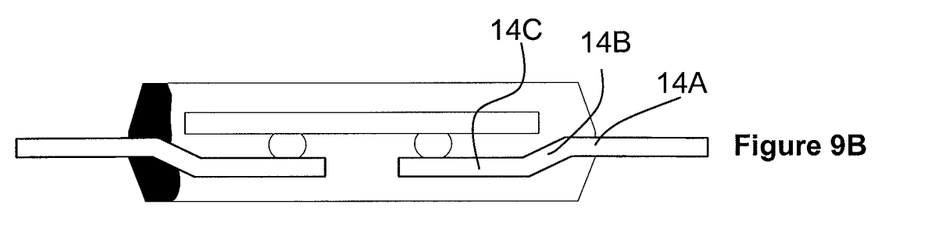

The method of manufacturing this embodiment of the leadframe flip-chip semiconductor package is shown in FIGS. 9A through 9E. First, the semiconductor die 2 is a attached to the leadframe 14 by solder bumps 11. Next, the semiconductor die 2 and a portion of the leadframe 14 are placed in a mold (not shown) and an encapsulant 7 is injected into the mold. FIGS. 9B though 9E show how the encapsulant (shown in black) flows in the mold.

Figure 9C:
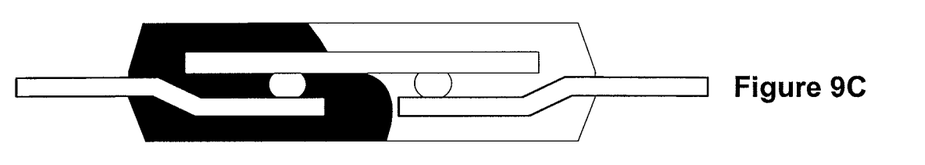
Figure 9D:
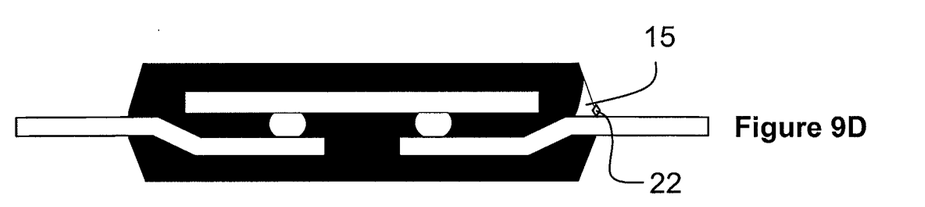
Figure 9E:
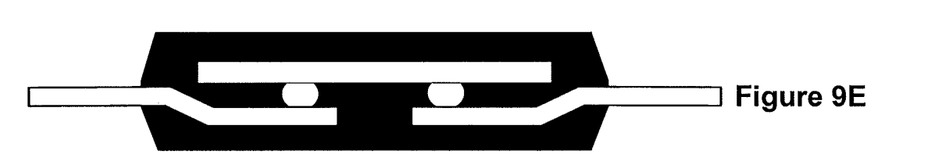

During the initial flow (FIG. 9B) the encapsulant is injected into a mold gate or mold inlet (not shown) and the encapsulant flow is balanced. As shown in FIG. 9C, as the encapsulant flows in the area of the semiconductor die, the flow becomes somewhat unbalanced. However, because the bottom channel is only slightly wider than the top channel because of the spacing of the semiconductor die and leadframe, as shown in FIG. 9C, the encapsulant flow is much more balanced than in the conventional design. As a result, as shown in FIG. 9D, the encapsulant flow does not begin to turn up to the top channel until the flow in the top channel is close to the end of the package. A tiny air vent 22 is located at the end of the mold where the flows will meet. This air vent 22 allows the air bubble 15 that is formed at the end of the package, to be vented from the package. FIG. 9E shows the final package that does not contain any voids.

FIGS. 6 and 10A through 10E illustrate cross-sectional views of a second exemplary embodiment of the inventive leadframe flip-chip semiconductor package and method and apparatus. The package includes a semiconductor die 2 attached to a leadframe 16 by conductive solder bumps or balls 11. An encapsulant 7 covers the semiconductor die 2 and portions of the leadframe 16. The leadframe 16 is designed with half-etched fingers. In the half-etch design, a portion of the leadframe (16B) that is attached to the semiconductor die 2 has a first thickness, a portion of the leadframe (16A) that enters the encapsulant 7 has a second thickness, and the first thickness is less than said second thickness. In one particular embodiment, the first thickness is approximately one-half of the second thickness. In addition, the semiconductor die 2 does not extend over any portion of the leadframe 16 that has the second thickness (16A).

The inclusion of the half-etch feature allows for a more balanced encapsulant flow as compared to the conventional design.

Figure 10A:
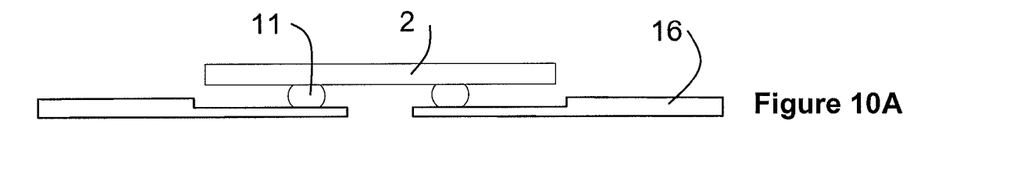
FIGS. 10A through 10E illustrate an a method of manufacturing a second embodiment of the inventive leadframe flip-chip semiconductor package.
Figure 10B:
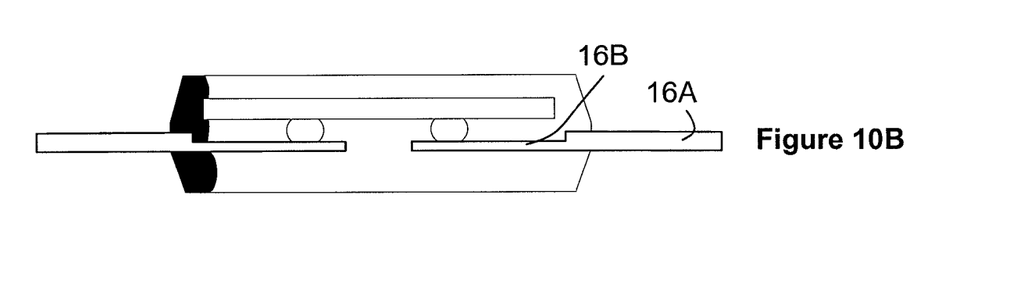

The method of manufacturing this embodiment of the leadframe flip-chip semiconductor package is shown in FIGS. 10A through 10E. First, the semiconductor die 2 is a attached to the leadframe 16 by solder bumps 11. Next, the semiconductor die 2 and a portion of the leadframe 16 are placed in a mold (not shown) and an encapsulant 7 is injected into the mold. FIGS. 10B though 10E show how the encapsulant (shown in black) flows in the mold.

Figure 10C:
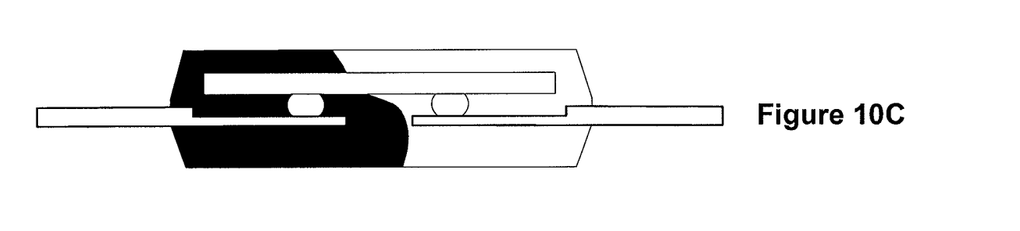
Figure 10D:
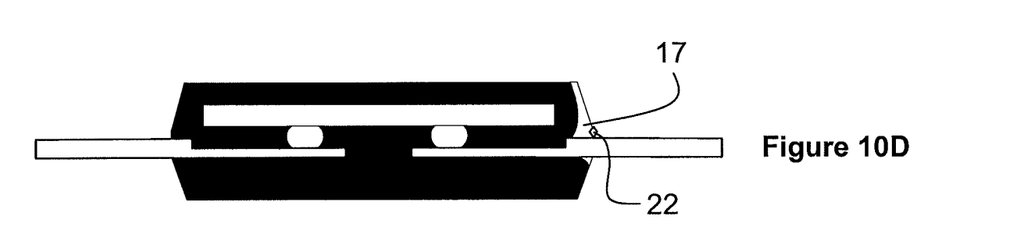
Figure 10E:
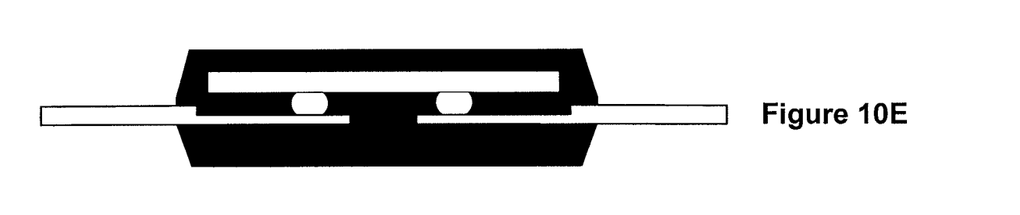

During the initial flow (FIG. 10B) the encapsulant is injected into a mold gate or mold inlet (not shown) and the encapsulant flow is balanced. As shown in FIG. 10C, as the encapsulant flows in the area of the semiconductor die, the flow becomes somewhat unbalanced. However, because the bottom channel is only slightly wider than the top channel because of the half-etched portion of the leadframe, as shown in FIG. 9C, the encapsulant flow is much more balanced than in the conventional design. As a result, as shown in FIG. 10D, the encapsulant flow does not begin to turn up to the top channel until the flow in the top channel is close to the end of the package. A tiny air vent 22 is located at the end of the mold where the flows will meet. This air vent 22 allows the air bubble 17 that is formed at the end of the package, to be vented from the package. FIG. 10E shows the final package that does not contain any voids.

FIGS. 7 and 11A through 11E illustrate cross-sectional views of a third exemplary embodiment of the inventive leadframe flip-chip semiconductor package and method and apparatus. The package includes a semiconductor die 2 attached to a leadframe 18 by conductive solder bumps or balls 11. An encapsulant 7 covers the semiconductor die 2 and portions of the leadframe 18. The leadframe 18 is designed with a down-set die paddle 18C. In the down-set design, the portion of the leadframe that is attached to the semiconductor die is at the same level as the portion of the leadframe that enters said encapsulant. For example, leadframe portion attached to the semiconductor die 2 is at the same level of the leadframe at point 18A. After entering the package, the leadframe also has a portion that slopes downward in portion 18B and then levels off at a die paddle portion 18C.

Figure 7:
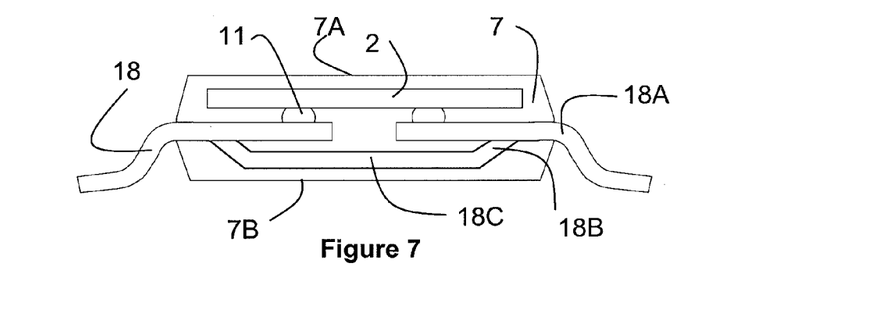
FIG. 7 illustrates a cross-sectional view of a third embodiment of the inventive leadframe flip-chip semiconductor package.

In addition, in this exemplary embodiment, the semiconductor die 2 is in a first plane that is above the portion (18A) of the leadframe that enters the encapsulant 7, which forms a second plane. The die paddle portion of the leadframe (18C) forms a third plane and the first, second and third planes are approximately evenly spaced between the top surface 7A of the semiconductor package and the bottom surface 7B of the semiconductor package. The even spacing allows for a more balanced mold flow as compared to the conventional design.

Figure 11A:
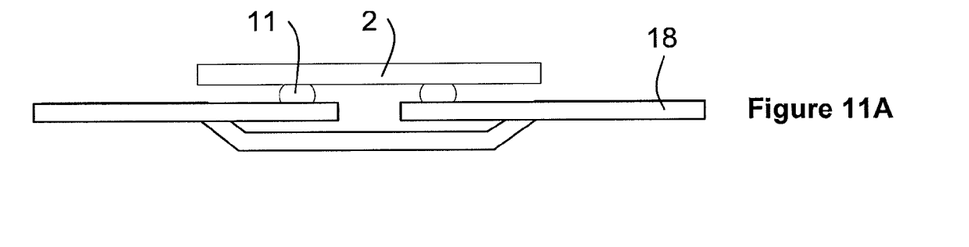
FIGS. 11A through 11E illustrate an a method of manufacturing a third embodiment of the inventive leadframe flip-chip semiconductor package.
Figure 11B:
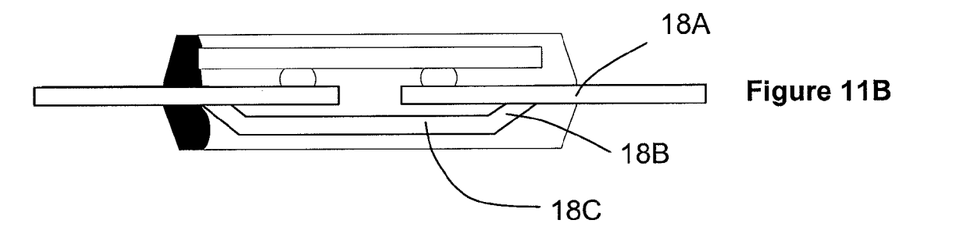

The method of manufacturing this embodiment of the leadframe flip-chip semiconductor package is shown in FIGS. 11A through 11E. First, the semiconductor die 2 is a attached to the leadframe 18 by solder bumps 11. Next, the semiconductor die 2 and a portion of the leadframe 18 are placed in a mold (not shown) and an encapsulant 7 is injected into the mold. FIGS. 11B though 11E show how the encapsulant (shown in black) flows in the mold.

Figure 11C:
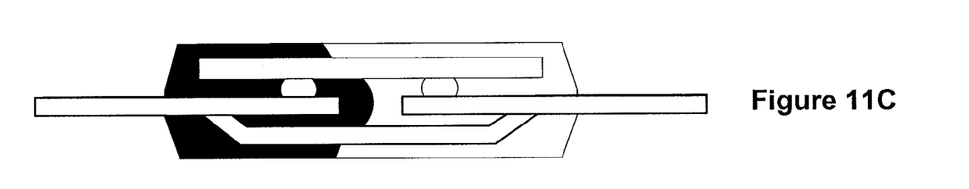
Figure 11D:
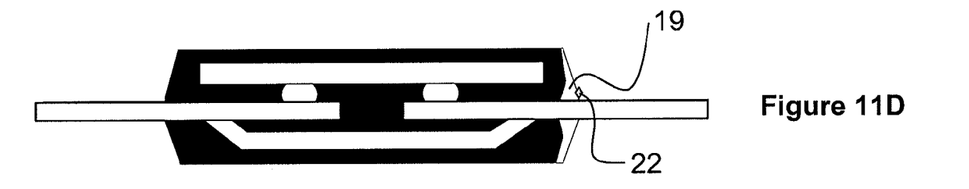
Figure 11E:
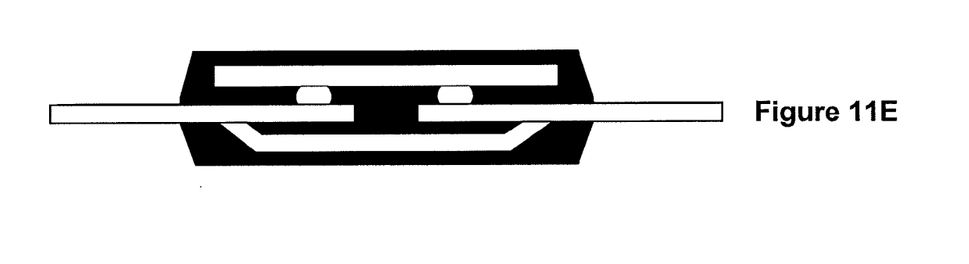

During the initial flow (FIG. 11B) the encapsulant is injected into a mold gate or mold inlet (not shown) and the encapsulant flow is balanced. As shown in FIG. 11C, as the encapsulant flows in the area of the semiconductor die, the flow becomes somewhat unbalanced. However, because the bottom channel and top channels are substantially the same size because of the spacing of the semiconductor die and leadframe, as shown in FIG. 11C, the encapsulant flow is much more balanced than in the conventional design. As a result, as shown in FIG. 11D, the encapsulant flow from the channels does not turn into each other. A tiny air vent 22 is located at the end of the mold where the flows will meet. This air vent 22 allows the air bubble 19 that is formed at the end of the package, to be vented from the package. FIG. 11E shows the final package that does not contain any voids.

FIGS. 8 and 12A through 12E illustrate cross-sectional views of a fourth exemplary embodiment of the inventive leadframe flip-chip semiconductor package and method and apparatus. The package includes a semiconductor die 2 attached to a leadframe 20 by conductive solder bumps or balls 11. An encapsulant 7 covers the semiconductor die 2 and portions of the leadframe 20. The leadframe 20 is designed with both a down-set die paddle 20D and a half-etched portion 20B. In this design, the portion of the leadframe (20B) that is attached to the semiconductor die is half-etched and at the same level as the portion of the leadframe that enters the encapsulant. For example, leadframe portion attached to the semiconductor die 2 is at the same level of the leadframe at point 20A. After entering the package, the leadframe also has a portion that slopes downward in portion 20C and then levels out at a die paddle portion 20D.

Figure 8:
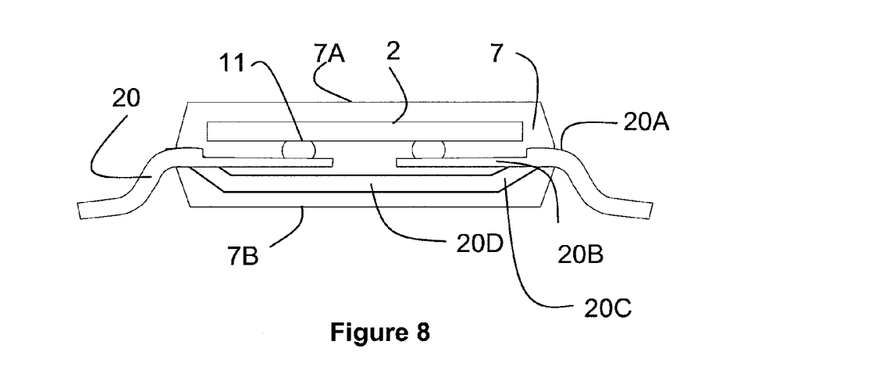
FIG. 8 illustrates a cross-sectional view of a fourth embodiment of the inventive leadframe flip-chip semiconductor package.

In addition, in this exemplary embodiment, the semiconductor die 2 is in a first plane that is above the portion (20A) of the leadframe that enters the encapsulant 7, which forms a second plane. The die paddle portion of the leadframe (20D) forms a third plane and the first, second and third planes are approximately evenly spaced between the top surface 7A of the semiconductor package and the bottom surface 7B of the semiconductor package. The even spacing allows for a more balanced mold flow as compared to the conventional design.

Also, like the second embodiment, the portion of the leadframe (20B) that is attached to the semiconductor die 2 has a first thickness, a portion of the leadframe (20A) that enters the encapsulant 7 has a second thickness, and the first thickness is less than said second thickness. In one particular embodiment, the first thickness is approximately one-half of the second thickness. In addition, the semiconductor die 2 does not extend over any portion of the leadframe 20 that has the second thickness (20A).

Figure 12A:
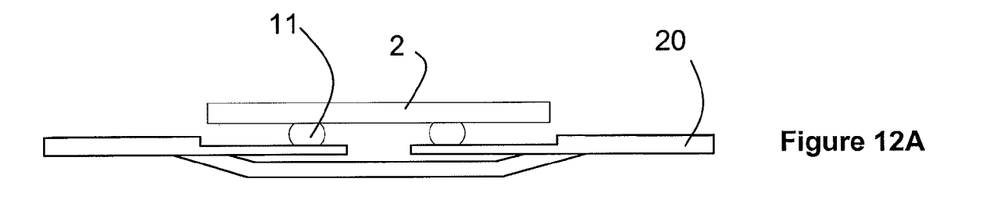
FIGS. 12A through 12E illustrate an a method of manufacturing a fourth embodiment of the inventive leadframe flip-chip semiconductor package.
Figure 12B:
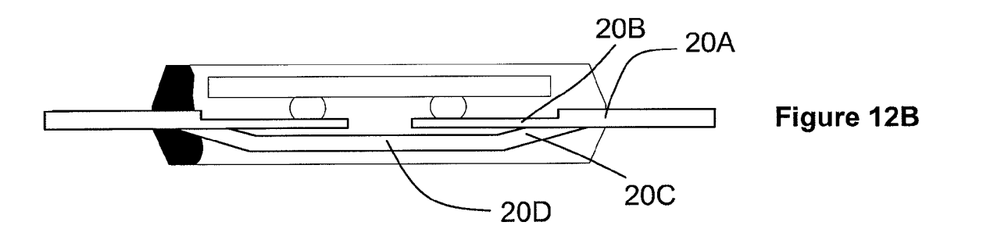

The method of manufacturing this embodiment of the leadframe flip-chip semiconductor package is shown in FIGS. 12A through 12E. First, the semiconductor die 2 is a attached to the leadframe 20 by solder bumps 11. Next, the semiconductor die 2 and a portion of the leadframe 20 are placed in a mold (not shown) and an encapsulant 7 is injected into the mold. FIGS. 12B though 12E show how the encapsulant (shown in black) flows in the mold.

Figure 12C:
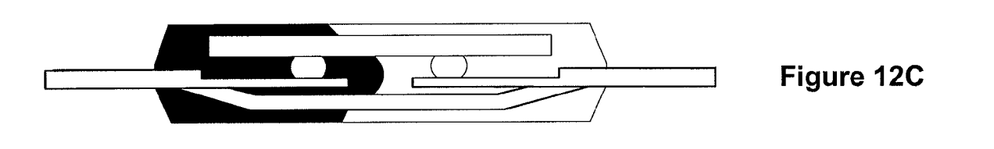
Figure 12D:
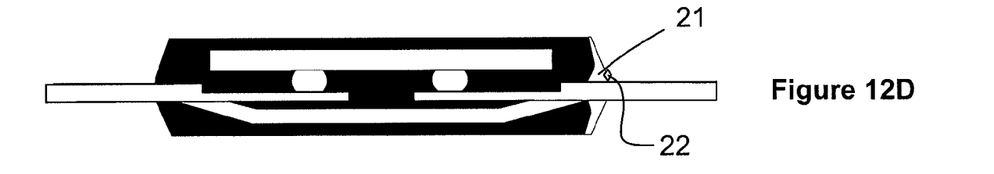
Figure 12E:
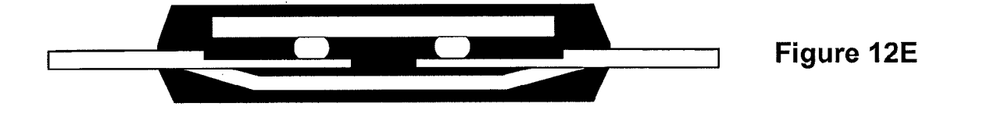
Figure 13:
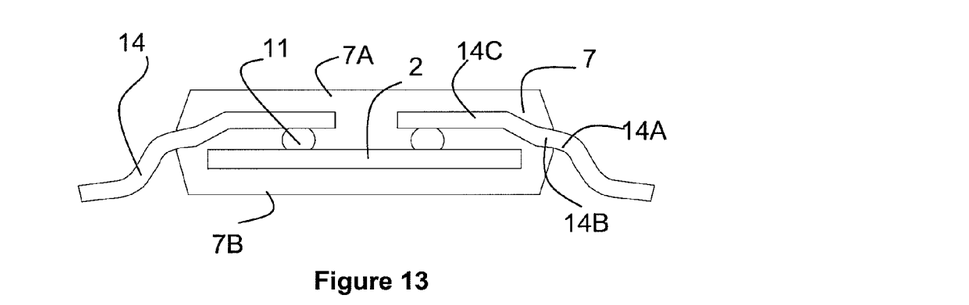
FIG. 13 illustrates a cross-sectional view of a fifth embodiment of the inventive leadframe flip-chip semiconductor package.
Figure 14:
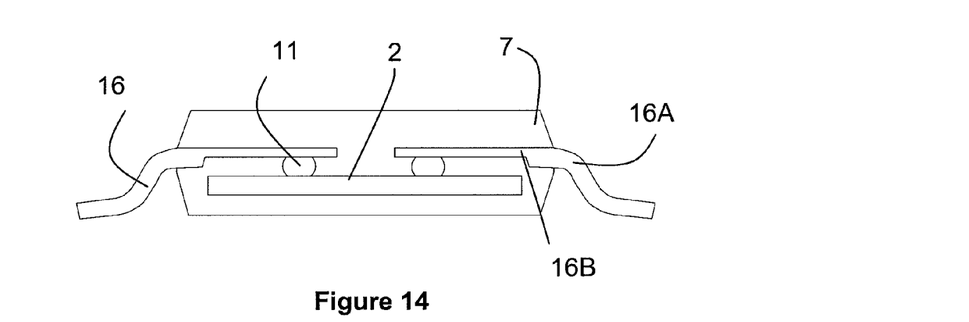
FIG. 14 illustrates a cross-sectional view of a sixth embodiment of the inventive leadframe flip-chip semiconductor package.
Figure 15:
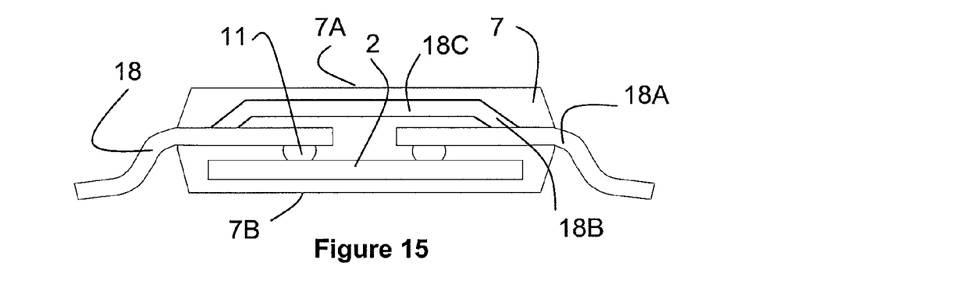
FIG. 15 illustrates a cross-sectional view of a seventh embodiment of the inventive leadframe flip-chip semiconductor package.
Figure 16:
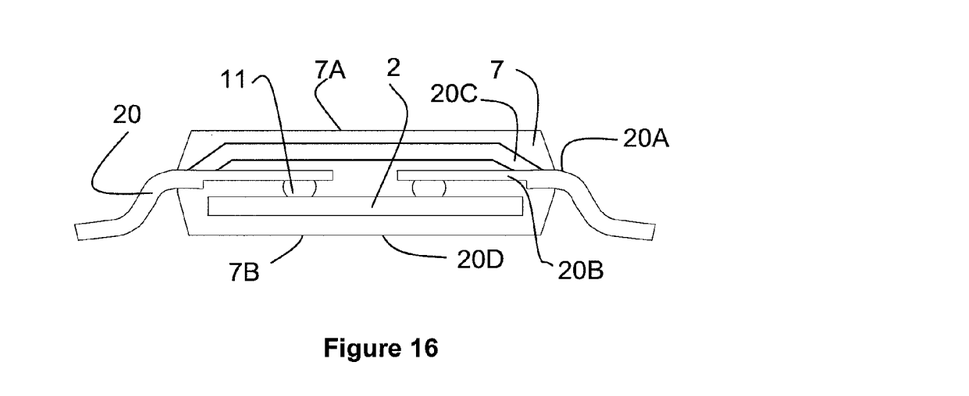
FIG. 16 illustrates a cross-sectional view of a eighth embodiment of the inventive leadframe flip-chip semiconductor package.

During the initial flow (FIG. 12B) the encapsulant is injected into a mold gate or mold inlet (not shown) and the encapsulant flow is balanced. As shown in FIG. 12C, as the encapsulant flows in the area of the semiconductor die, the flow becomes somewhat unbalanced. However, because the bottom channel and top channels are substantially the same size because of the spacing of the semiconductor die and leadframe, and because of the half-etched portion, as shown in FIG. 12C, the encapsulant flow is much more balanced than in the conventional design. As a result, as shown in FIG. 12D, the encapsulant flow from the channels does not turn into each other. A tiny air vent 22 is located at the end of the mold where the flows will meet. This air vent 22 allows the air bubble 21 that is formed at the end of the package, to be vented from the package. FIG. 12E shows the final package that does not contain any voids.

FIGS. 5 through 8 show embodiments of the semiconductor package with the die above the leadframe, similar to the package shown in FIG. 2. However, as shown in FIGS. 13 through 16, the present invention would also apply to semiconductor packages with the die below the leadframe, similar to the package shown in FIG. 3.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a leadframe comprising a first portion and a second portion;
   only one semiconductor die;
   said semiconductor die attached only to said first portion of said leadframe; and
   an encapsulant covering said leadframe and semiconductor die, including said first and second portions;
   wherein said second portion of said leadframe is below said first portion of said leadframe and said semiconductor die; and
   wherein said second portion extends continuously from one end of said semiconductor die to another end of said semiconductor die;
   wherein a portion of said leadframe that is attached to said semiconductor die has a first thickness, a portion of the leadframe that enters said encapsulant has a second thickness, and said first thickness is less than said second thickness; and
   wherein said leadframe comprises a portion that slants downward after entering said encapsulant.

2. The semiconductor package of claim 1, wherein said semiconductor die is attached to said lead frame by a solder ball.

3. The semiconductor package of claim 1, wherein said semiconductor die is in a first plane that is above the portion of the leadframe that enters said encapsulant.

4. The semiconductor package of claim 1, wherein said semiconductor die is in a first plane extending through the middle of said die, said first portion of said leadframe forms a second plane extending through the middle of said first portion, said second portion of said leadframe forms a third plane extending through the middle of said second portion, and said first, second and third planes are approximately evenly spaced between a top surface of said semiconductor package and a bottom surface of said semiconductor package.

5. The semiconductor package of claim 1, wherein a top channel with a first thickness is formed between said semiconductor die and the top surface of said semiconductor package, a bottom channel with a second thickness is formed between second portion of leadframe and the bottom surface of said semiconductor package, and wherein said first thickness and said second thickness are substantially the same size.

6. A semiconductor package comprising:
   a leadframe comprising a first portion and a second portion;
   only one semiconductor die;
   said semiconductor die attached only to said first portion of said leadframe; and
   an encapsulant covering said leadframe and semiconductor die, including said first and second portions;

wherein said second portion of said leadframe is below said first portion of said leadframe and said semiconductor die; and wherein a portion of said leadframe that is attached to said semiconductor die has a first thickness, a portion of the leadframe that enters said encapsulant has a second thickness, and said first thickness is less than said second thickness: and wherein said leadframe comprises a portion that slants downward after entering said encapsulant.

7. The semiconductor package of claim 6, wherein said first thickness is approximately one-half of the second thickness.

8. The semiconductor package of claim 6, wherein said semiconductor die does not extend over any portion of the leadframe that has said second thickness.

9. The semiconductor package of claim 6, wherein where the leadframe enters said encapsulation, there is a first plane at top of the leadframe and a second plane at the bottom of the leadframe;

wherein there is a third plane at the top of the portion of the leadframe that is attached to the semiconductor die; and wherein third plane is between said first and second planes.

10. A semiconductor package comprising:

a leadframe comprising a first portion and a second portion;

a semiconductor die only attached to said first portion of said leadframe; and an encapsulant covering said leadframe and semiconductor die, including said first and second portions;

wherein said second portion of said leadframe is below said first portion of said leadframe and said semiconductor die;

wherein said semiconductor die is in a first plane extending through the middle of said die, said first portion of said leadframe forms a second plane extending through the middle of said first portion, said second portion of said leadframe forms a third plane extending through the middle of said second portion, and said first, second and third planes are approximately evenly spaced between a top surface of said semiconductor package and a bottom surface of said semiconductor package;

wherein a portion of said leadframe that is attached to said semiconductor die has a first thickness, a portion of the leadframe that enters said encapsulant has a second thickness, and said first thickness is less than said second thickness; and wherein said leadframe comprises a portion that slants downward after entering said encapsulant.

11. The semiconductor package of claim 10, wherein said semiconductor die is attached to said lead frame by a solder ball.

12. The semiconductor package of claim 10, wherein said semiconductor die is in a first plane that is above the portion of the leadframe that enters said encapsulant.

13. The semiconductor package of claim 10, wherein said first thickness is approximately one-half of the second thickness.

14. The semiconductor package of claim 10, wherein said semiconductor die does not extend over any portion of the leadframe that has said second thickness.

15. A semiconductor package comprising:

a leadframe comprising a first portion and a second portion;

a semiconductor die attached to said first portion of said leadframe; and an encapsulant covering said leadframe and semiconductor die, including said first and second portions;

wherein said second portion of said leadframe is below said first portion of said leadframe and said semiconductor die;

wherein a portion of said leadframe that is attached to said semiconductor die has a first thickness, a portion of the leadframe that enters said encapsulant has a second thickness, and said first thickness is less than said second thickness;

wherein said semiconductor die does not extend over any portion of the leadframe that has said second thickness; and wherein said leadframe comprises a portion that slants downward after entering said encapsulant.

16. The semiconductor package of claim 15, wherein said semiconductor die is attached to said lead frame by a solder ball.

17. The semiconductor package of claim 15, wherein said semiconductor die is in a first plane that is above the portion of the leadframe that enters said encapsulant.

18. The semiconductor package of claim 15, wherein said semiconductor die is in a first plane, said first portion of said leadframe forms a second plane, said second portion of said leadframe forms a third plane, and said first, second and third planes are approximately evenly spaced between a top surface of said semiconductor package and a bottom surface of said semiconductor package.

19. The semiconductor package of claim 15, wherein said first thickness is approximately one-half of the second thickness.

* * * * *